(12) United States Patent
Hotta

(10) Patent No.: US 7,348,631 B2
(45) Date of Patent: Mar. 25, 2008

(54) THIN FILM TRANSISTOR SUBSTRATE AND MANUFACTURING METHOD FOR THE SAME

(75) Inventor: Kazushige Hotta, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 104 days.

(21) Appl. No.: 11/420,621

(22) Filed: May 26, 2006

(65) Prior Publication Data

US 2007/0111411 A1    May 17, 2007

(30) Foreign Application Priority Data

May 30, 2005    (JP)    ............ 2005-157792

(51) Int. Cl.
   H01L 29/76    (2006.01)

(52) U.S. Cl. ............... 257/344; 438/157; 257/E29.287; 257/347

(58) Field of Classification Search ........ 257/336–347, 257/E29.287; 438/157
See application file for complete search history.

(56) References Cited

U.S. PATENT DOCUMENTS

| | | | |
|---|---|---|---|
| 6,737,672 B2 | 5/2004 | Hara et al. | |
| 6,777,716 B1 | 8/2004 | Yamazaki et al. | |
| 6,964,891 B2 | 11/2005 | Hotta | |
| 2003/0025127 A1 | 2/2003 | Yanai et al. | |
| 2004/0253771 A1* | 12/2004 | Yamazaki et al. | 438/149 |
| 2005/0127412 A1* | 6/2005 | Cohen et al. | 257/288 |
| 2006/0006425 A1 | 1/2006 | Hotta | |

FOREIGN PATENT DOCUMENTS

| | | |
|---|---|---|
| JP | 07-249778 A | 9/1995 |
| JP | 2000-299469 A | 10/2000 |
| JP | 2003-45892 A | 2/2003 |
| JP | 2003-086505 A | 3/2003 |
| JP | 2004-228480 A | 8/2004 |

* cited by examiner

*Primary Examiner*—Richard A. Booth
(74) *Attorney, Agent, or Firm*—Keating & Bennett, LLP

(57) ABSTRACT

A thin film transistor substrate is provided whose structure allows for the formation of (i) a thick gate insulating film, (ii) a high pressure resistance TFT having a LDD region of a GOLD structure, and (iii) a low voltage TFT having a thin gate insulating film, with less number of production steps.

4 Claims, 14 Drawing Sheets

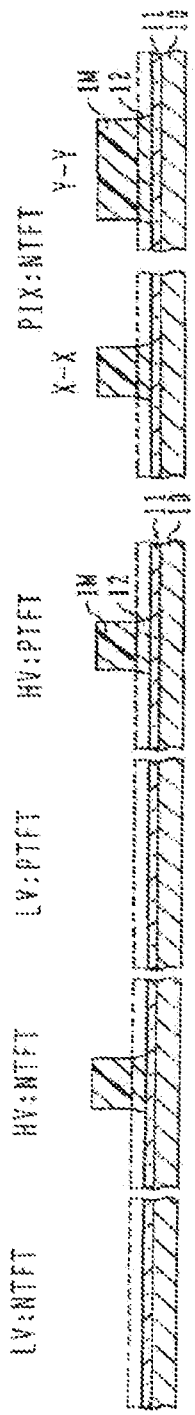
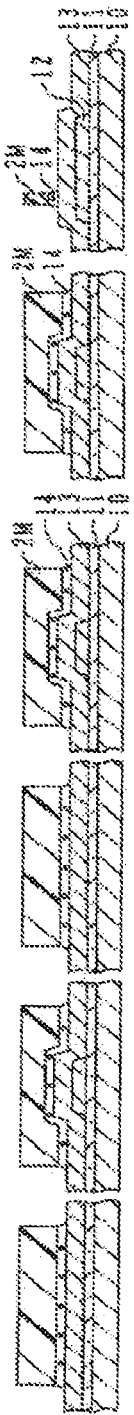
FIG. 1A
FIG. 1B
FIG. 1C
FIG. 1D

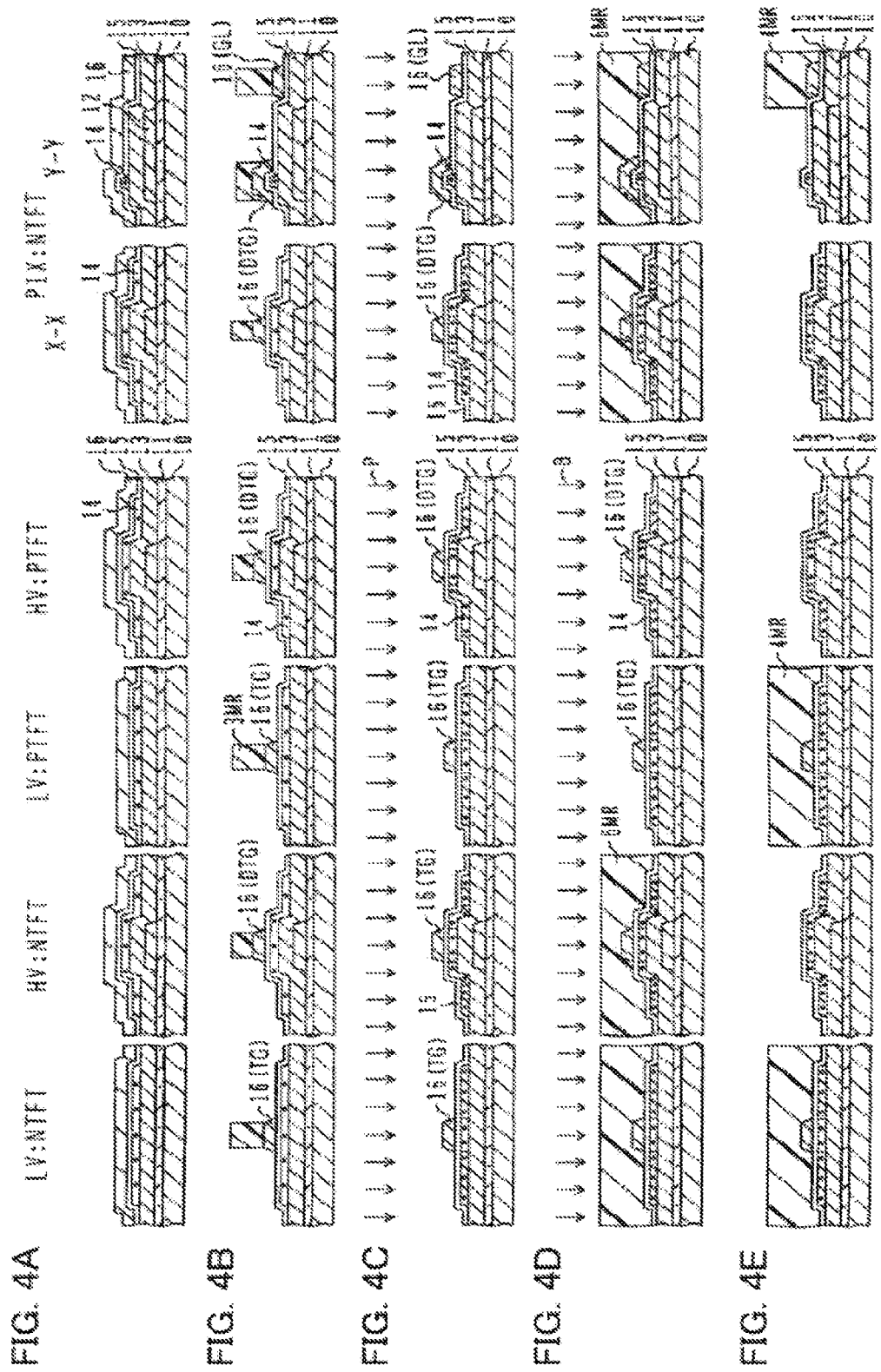

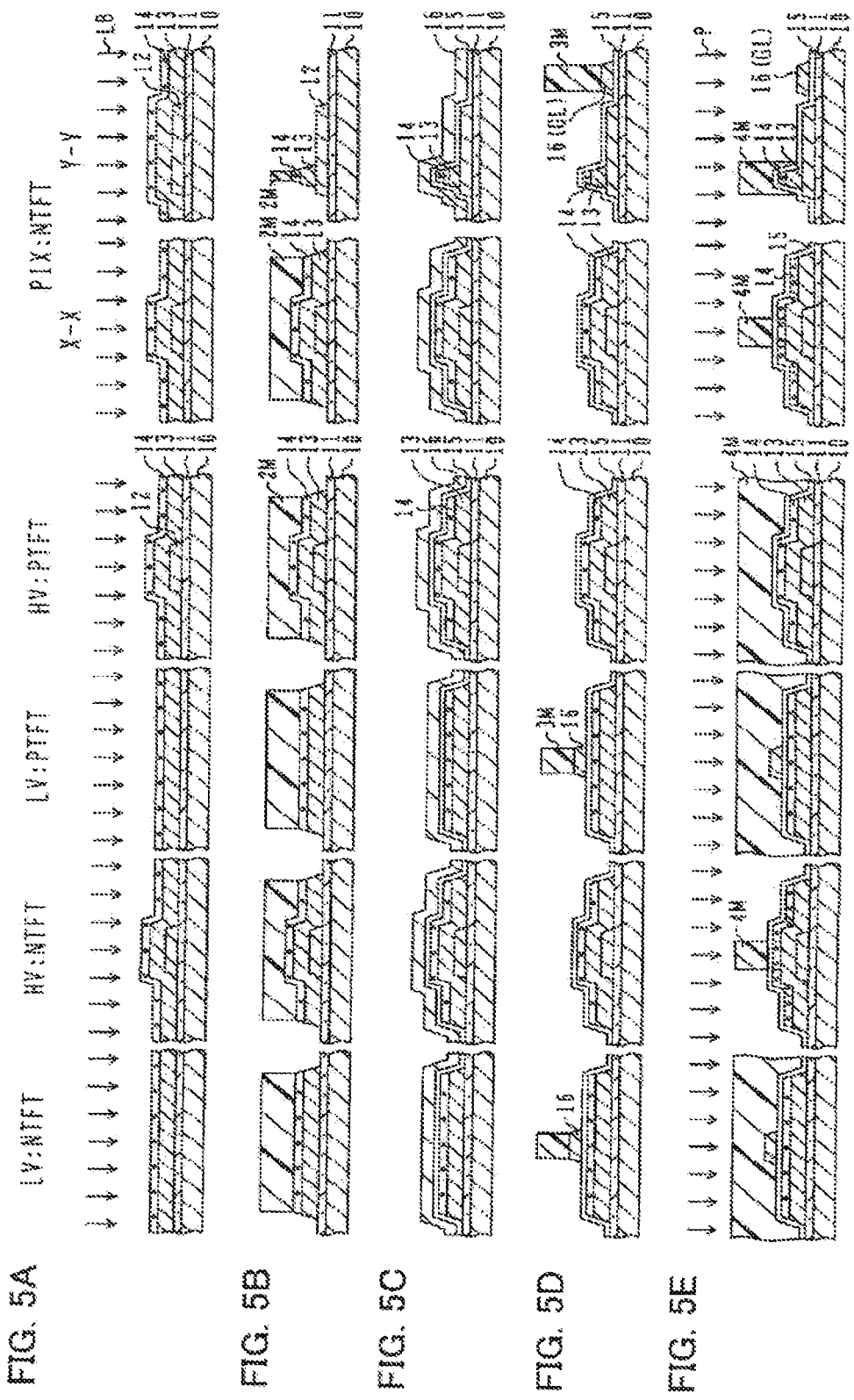

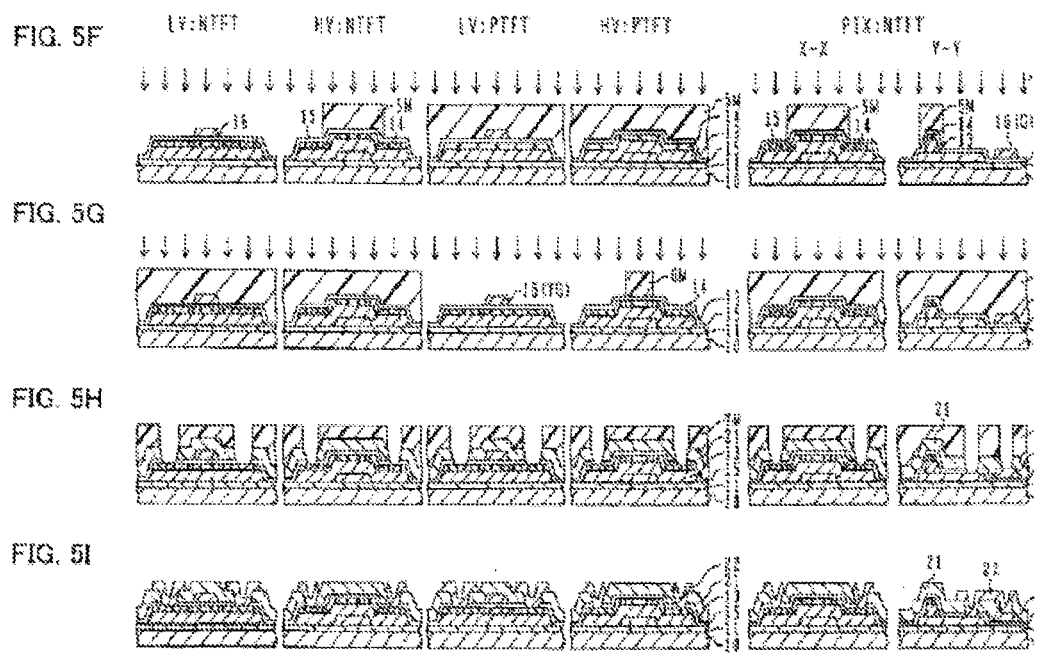

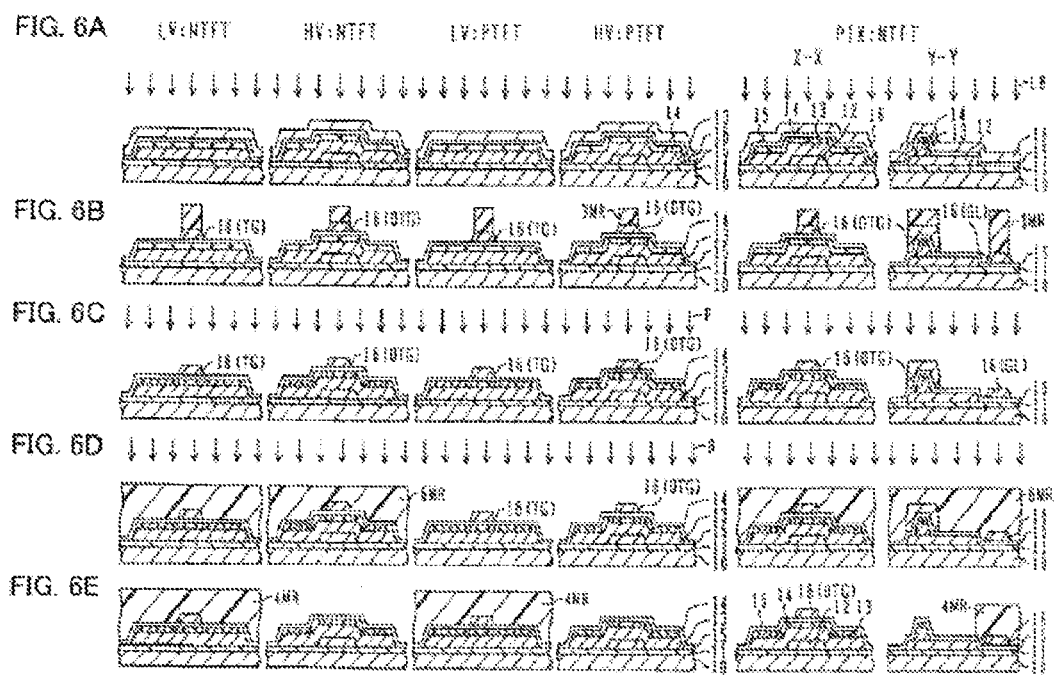

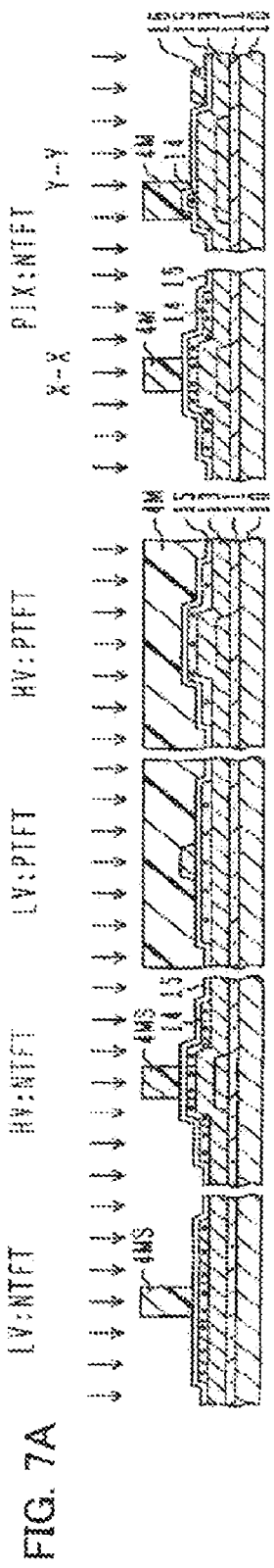
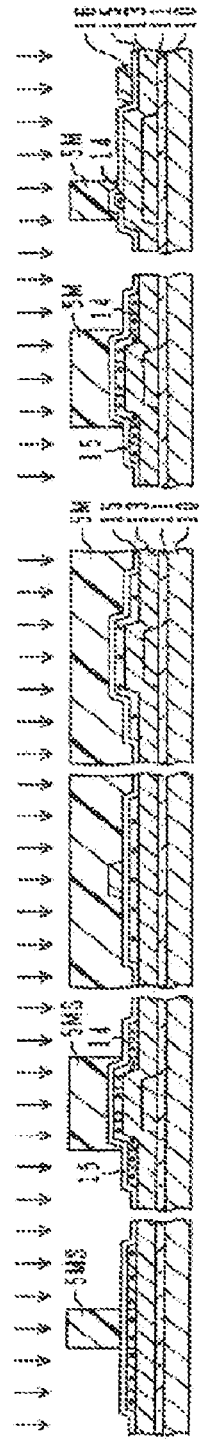
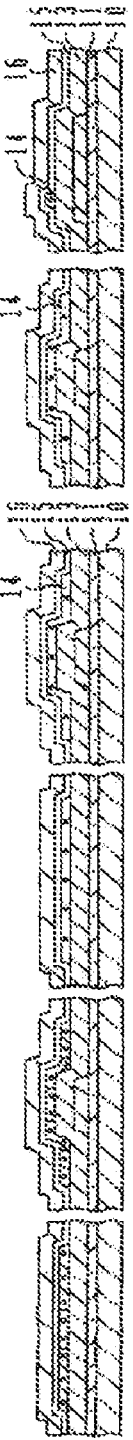
FIG. 7A
FIG. 7B
FIG. 7C
FIG. 7D

FIG. 8A
FIG. 8B
FIG. 8C
FIG. 8D
FIG. 8E

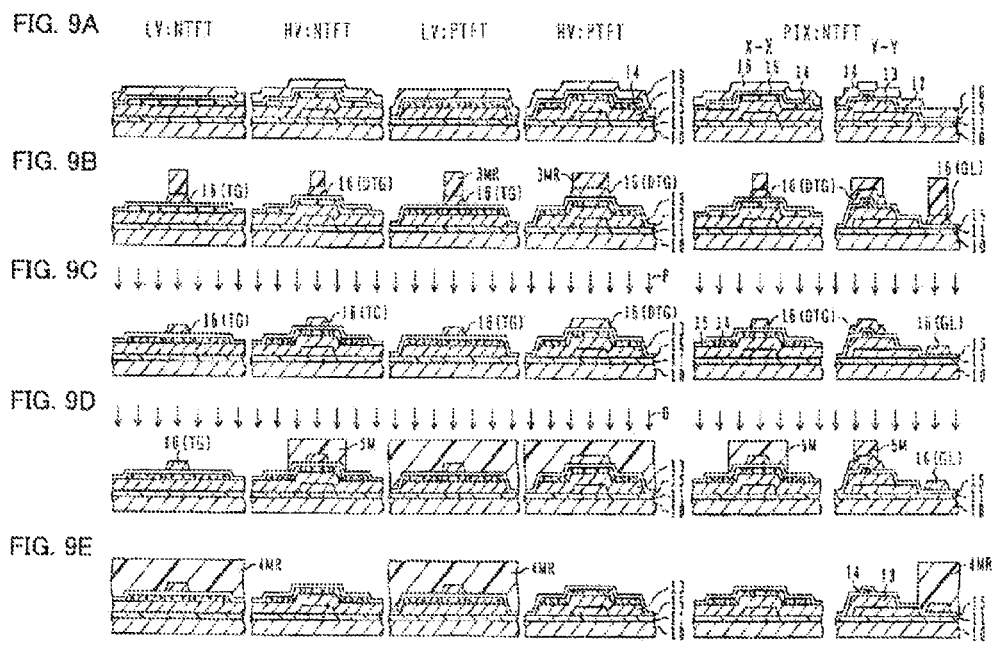

THIN FILM TRANSISTOR SUBSTRATE AND MANUFACTURING METHOD FOR THE SAME

This Nonprovisional application claims priority under 35 U.S.C. § 119(a) on Patent Application No. 157792/2005 filed in Japan on May 30, 2005, the entire contents of which are hereby incorporated by reference.

FIELD OF THE INVENTION

The present invention relates to a thin film transistor substrate for a display device such as a liquid crystal display device, and a manufacturing method for the thin film transistor substrate. The present invention particularly relates to a thin film transistor substrate having a display region and periphery circuits, and a manufacturing method for the thin film transistor substrate.

BACKGROUND OF THE INVENTION

A liquid crystal display device has some particular features such as the thin and light-weighted body, low power consumption, and has been widely used not only for a large display of television, personal computer etc. but also for a compact display of camera, portable movie camera, mobile phone, mobile terminal etc. A liquid crystal panel uses a polycrystal silicon (p-Si) thin film transistor (TFT) as a transistor for pixel driving, and is capable of integrating periphery drive circuits made of p-SiTFT outside the display region. Particularly, a low temperature polycrystal silicon thin film transistor substrate using an inexpensive glass substrate can be easily enlarged in size, and therefore has been recently used for an organic EL device in addition to its general usage for a liquid crystal display device.

A liquid crystal display device has various drive circuits such as a display controller, shift register etc., which are preferably capable of high speed driving, output buffer, level shifter, analog switch etc., which preferably have high pressure resistances. If the high speed driving is the first priority, the TFT preferably has a short channel length and does not include a LDD structure. On the other hand, if the high pressure resistance is indispensable, a desirable speed may not be obtained. For the TFT for pixel driving, the high pressure resistance is more important factor than high speed driving. A high pressure resistance TFT is required to endure a certain arbitrary level of high voltage, and therefore is preferably formed with a LDD or a gate insulating film having a sufficient thickness.

A pixel driving TFT is required to have a function of writing a data voltage when the gate voltage is on, and also a function of holding the written data voltage until the next data voltage is written. Therefore, it is preferable to reduce the leak current to a possible maximum degree when the gate voltage is off. To reduce the leak current, it is preferable to provide a lightly doped drain (LDD) between the channel of p-SiTFT and a low-resistance (highly doped) source/drain region. The pixel transistor is formed of an n-channel TFT (NTFT) having a higher performance than a p-channel TFT (PTFT).

A liquid crystal display device has some periphery circuits including an input-output circuit, which has a high pressure resistance, and a logic circuit. The logic circuit such as a shift register is preferably driven at a high speed. Therefore, two kinds of periphery p-SiTFT: a high pressure resistance transistor and a high speed transistor are required. Further, the periphery circuits are constituted of complementary MOS (CMOS) TFTs including a NTFT and a PTFT.

For a display of a mobile terminal or other small devices, reduction of power consumption is indispensable. Though a display section and some other parts need to be driven by a high voltage of 7V to 10V, a logic circuit section is preferably driven by a possible lowest voltage. To ensure the pressure resistance in the display section, the gate insulation film is required to have a thickness of 80-150 nm, but this spec is not suitable for the drive circuit section. Specifically, a drive circuit of this spec needs to be driven by a high voltage, thereby increasing power consumption. Low voltage driving is necessary for the logic circuit section to reduce power consumption; that is, two transistors are required: a transistor with a thick gate insulation film and a transistor with a thin gate insulating film.

Japanese Laid-Open Patent Application Tokukaihei 07-249778 (published on Sep. 26, 1995) teaches manufacturing of two kinds of transistors: a top-gate transistor and a bottom-gate transistor. In this structure with two gate transistors, the leak current decreases by offsetting the drain from the gate electrodes.

In a general method of polycrystallization of an amorphous silicon film by excimer laser, the thickness of film is limited. Therefore, when polycrystallization is performed with excimer laser after forming a gate insulating film and an amorphous silicon film, which are deposited on a bottom gate, the end section of the bottom gate electrode cannot be fully crystallized.

Japanese Laid-Open Patent Application Tokukai 2003-45892 (published on Feb. 14, 2003) teaches stacking a gate insulating film on a polycrystallization silicon film, forming a plurality of top-gate thin film transistors each having a gate insulating film of a different thickness. This invention suggests forming a lightly doped drain (LDD) region in the drain for a high pressure resistance n-type TFT, and forming a LDD region both in the drain and source for a pixel transistor.

According to the description (e.g. in the section of "Prior Art") of Japanese Laid-Open Patent Application Tokukai 2000-299469 (published on Oct. 24, 2000), the OFF current of p-SiTFT tends to increase, while the ON current tends to decrease due to the hot-carrier effect. More specifically, hot-carrier generated by a high electric field in the vicinity of the drain is trapped in the gate insulating film, thereby decreasing the ON current. A GOLD (gate-drain overlapped LDD) structure, in which the gate electrode is overlapped with the LDD region, has an effect of reducing the high electric field in the vicinity of the drain, by which the hot-carrier effect also decreases. To form a LDD region beneath the gate electrode, it is necessary to form the LDD region with a mask before forming the gate electrode.

In recent years, lateral crystallization using continuous wave (CW) laser has come to the front as a replacement of excimer laser. Though crystallization using CW laser has been conventionally suggested, it has not been able to ensure a certain crystallization effect because of variation of laser light, more specifically, an excessive laser power density with respect to the energy for crystallization causes the film to be aggregated.

Japanese Laid-Open Patent Application Tokukai 2003-86505 (published on Mar. 20, 2003) teaches a polycrystallization method in which an amorphous semiconductor layer is first patterned into an island shape, and then is irradiated with continuous wave (CW) laser light from the rear surface of the transparent substrate. The method uses a solid state laser (DPSS laser) for semiconductor (LD) excitation. This method has an effect of increasing the size of crystal.

Scanning of an amorphous silicon film, which has been shaped into a several tens to several hundreds μm thick layer, by CW laser beam results in generation of a polycrystalline silicon film along the scanning direction, with an average grain diameter of several μm or greater.

This irradiation is spot irradiation, which takes a significantly long time. The irradiation time may be reduced by performing polycrystallization by irradiation of only the element (such as TFT) forming region. For example, in forming a ribbon-shaped amorphous silicon film, a marker is formed with the ribbon, and only the TFT forming region is crystallized with the marker. Further, in the display region, only the pixel transistor forming region may be subjected to laser irradiation, which further reduces the irradiation time. The irradiation may be carried out by using a plurality of laser beams which are emitted simultaneously.

In recent technologies, the condition in the pre-processing of crystallization and in the laser irradiation are optimized, and therefore polycrystallization is carried out without forming a ribbon, causing no film removal. In the case where the amorphous film is not patterned, it is necessary to form the marker in advance. Compared with crystallization by excimer laser, this method with an extra marker forming process is lower in productivity.

SUMMARY OF THE INVENTION

An object of the present invention is to provide a thin film transistor substrate including a (i) high pressure resistance TFT having a LDD region of a GOLD structure, and (ii) a low voltage TFT driven at a high-speed, which transistor substrate is manufactured with a simple production process.

Another object of the present invention is to provide a method of manufacturing the thin film transistor substrate including (i) a high pressure resistance TFT having a LDD region of a GOLD structure, and (ii) a low voltage TFT driven at a high-speed, with less number of production steps.

Specifically, a thin film transistor substrate according to the present invention comprises: a substrate; a first bottom gate electrode formed above the substrate; a first gate insulating film formed above the substrate, the first gate insulating film covering the first bottom gate electrode; a plurality of island-shaped semiconductor films formed above the first gate insulating film, the island-shaped semiconductor films including a first island-shaped semiconductor film which intersects with the first gate insulating film; a second gate insulating film formed above the first gate insulating film, the second gate insulating film being thinner than the first gate insulating film and covering the plurality of island-shaped semiconductor films; a first top gate electrode formed above the second gate insulating film, the first top gate electrode intersecting with a second island-shaped semiconductor film of the plurality of island-shaped semiconductor films which does not intersect with the first bottom gate electrode; a first conductive type source/drain region formed on each of the first and second island-shaped semiconductor films, the first conductive type source/drain region being formed on either side of the first or second bottom gate electrode; and a first conductive type LDD region formed on the first island-shaped semiconductor film, the first conductive type LDD region being formed on a portion more inside than the first conductive type source/drain region and partially covering the first bottom gate electrode excluding a channel region which resides above the first bottom gate electrode, the first conductive type LDD region being lower in impurity concentration than the first conductive type source/drain region.

Further, a method of manufacturing a thin film transistor substrate according to the present invention comprises the steps of: (a) forming a bottom gate electrode above a substrate; (b) forming a first gate insulating film above the substrate so as to cover the bottom gate electrode (c) forming a plurality of island-shaped semiconductor films above the first gate insulating film, one of the island-shaped semiconductor films intersects with the bottom gate electrode; the step (c) including the sub-steps of: (c-1) depositing an amorphous semiconductor film; (c-2) polycrystallizing the amorphous semiconductor film by irradiation of laser beam; and (c-3) patterning a polycrystal obtained from the amorphous semiconductor film in the sub-step (c-2), (d) forming a second gate insulating film above the first gate insulating film with a smaller thickness than the first gate insulating film, so as to cover the plurality of island-shaped semiconductor films; (e) forming a top gate electrode above the second gate insulating film so that the top gate electrode intersects with one of the plurality of island-shaped semiconductor films which does not intersect with the bottom gate electrode; (f) forming a source/drain region by injecting a first conductive type impurity into (i) the island-shaped semiconductor film intersecting with the bottom gate electrode and into (ii) the island-shaped semiconductor film intersecting with the top gate electrode, the source/drain region being formed on either side of the bottom gate electrode or the top gate electrode; and (g) forming an LDD region by injecting a first conductive type impurity into the island-shaped semiconductor film above the bottom gate electrode, the LDD region being formed on a portion more inside than the source/drain region and partially covering the bottom gate electrode excluding a channel region which resides above the bottom gate electrode, the LDD region being lower in impurity concentration than the source/drain region.

The foregoing structure and the method of a thin film transistor substrate, including a bottom gate electrode, a thick gate insulating film, a semiconductor layer, a thin gate insulating film and a top gate electrode, has an effect of an arbitrary formation of the high pressure resistance TFT or the low voltage TFT driven at a high-speed. Further, another effect is impurity injection from above the layer, which is possible because the gate electrode does not exist above the semiconductor film of the high pressure resistance.

Further, still another effect is simultaneous formation of a marker with the bottom gate electrode. With this effect an extra marker forming step is not necessary.

Additional objects, features, and strengths of the present invention will be made clear by the description below. Further, the advantages of the present invention will be evident from the following explanation in reference to the drawings.

BRIEF DESCRIPTION OF THE DRAWINGS

FIGS. 1A through 1L are cross-sectional views for showing a manufacturing method of a thin film transistor substrate according to the first embodiment of the present invention.

FIGS. 4A through 4E are cross-sectional views for showing a modification of the first embodiment of the present invention.

FIGS. 5A through 5I are cross-sectional views for showing a manufacturing method of a thin film transistor according to the second embodiment of the present invention.

FIGS. 6A through 6E are cross-sectional views for showing a modification example of the second embodiment of the present invention.

FIGS. 7A through 7D are cross-sectional views for showing a modification example of the embodiment of the present invention.

FIGS. 8A through 8E are cross-sectional views for showing a manufacturing method of a thin film transistor substrate according to the third embodiment of the present invention.

FIGS. 9A through 9E are cross-sectional views for showing a modification example of the third embodiment.

DESCRIPTION OF THE EMBODIMENTS

The periphery circuits of the liquid crystal display device are integrated on the TFT. A liquid crystal display device uses two kinds of TFTs: a TFT supposed to be driven at a high speed, and a TFT having a high pressure resistance and a small leak current, such as a pixel TFT. Prior to describing a concrete example of the present invention, the following first explains a thin film transistor substrate of a liquid crystal display device.

Figure 10:
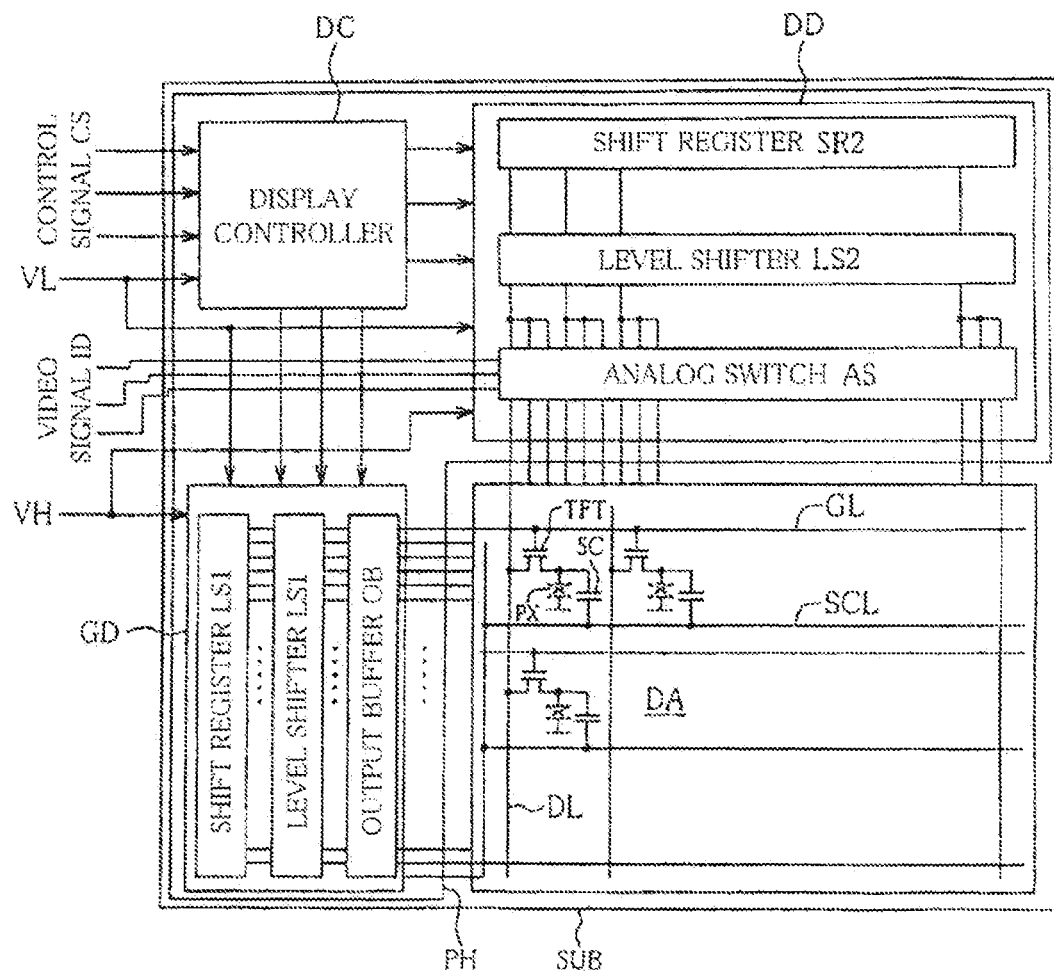
FIG. 10 is a plan view showing a structure example of an active matrix substrate of a liquid crystal display device.

FIG. 10 shows an active matrix substrate of a liquid crystal display device. The active matrix substrate is arranged such that a display region DA for performing a display and a periphery circuit region PH having the periphery circuits are formed on an insulating transparent substrate SUB which is made of a glass or the like. In the display region DA, a plurality of scanning gate wires (bus line) GL extend horizontally (in a row), and a plurality of pixel data wires (bus line) DL for supplying video data extend vertically (in a column).

Each intersection of a scanning gate wire GL and an video data wire DL is connected to an individual thin film transistor TFT. The output terminal of the thin film transistor is connected to a pixel electrode PX constituted of a transparent electrode such as ITO. Further, each pixel electrode PX is connected to an auxiliary capacitor SC. The other electrode of the auxiliary capacitor SC are connected to an auxiliary capacitor wire (bus line) SCL which is kept at a constant potential. The auxiliary capacitor wire SCL extends in the low direction in the figure, but it may extend in the column direction.

In the periphery circuit region PH, a gate driver GD, a data driver DD, and a display controller DC are provided. The gate driver GD generates a group of scanning signals which are to be supplied to the scanning gate wire. The data driver DD supplies video data to the video data wire. The display controller DC controls the gate driver GD and the data driver DD according to an externally supplied control signal CS. The gate driver mainly includes a shift register SR1, a level shifter LS1, and an output buffer OB. The data driver DD includes a shift register SR2, a level shifter LS2, and an analog switch AS. Reference voltages VL and VH, and a video signal ID are externally supplied. The display controller DC may be connected to a separate integrated circuit chip.

In the active matrix substrate with the integrated periphery circuits, the display controller DC, and the shift resisters SR1 and SR2 are required to be driven at a relatively high speed. The level shifters LS1 and LS2, the output buffer OB, and the analog switch AS are required to be driven by a relatively high voltage (i.e. they must have high pressure resistances), and preferably ensure high driving performances.

The switching thin film transistor (TFT) used in the display region is required to have a relatively high pressure resistance. For example, the high pressure resistance TFT serving as a drive circuit and a pixel TFT are constituted of high pressure resistance TFTs. The TFTs in the display region DA may be constituted only of n-channel TFTs, but the periphery circuit PH is preferably formed of a CMOS circuit. That is, a p-channel TFT is provided in addition to the n-channel TFT. A circuit used in a display device using a polycrystal silicon generally includes an auxiliary capacitor made of a MOS capacitor.

The following explains an embodiment of the present invention for a high pressure resistant CMOSTFT, a low voltage CMOSTFT, and a pixel TFT.

Figure 1E:
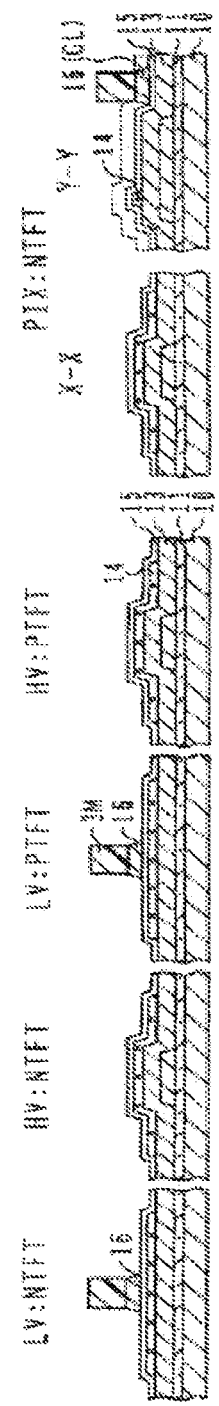
Figure 1F:
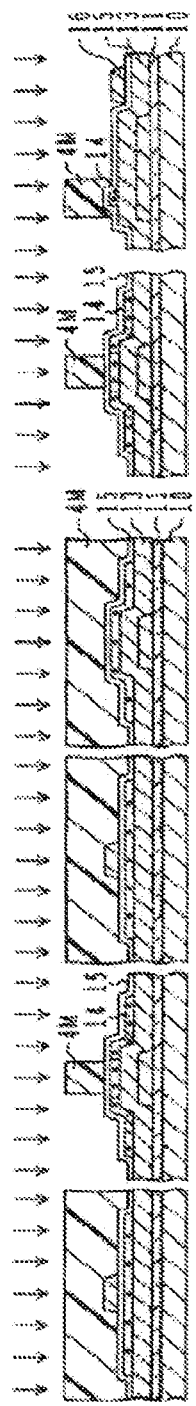
Figure 1G:
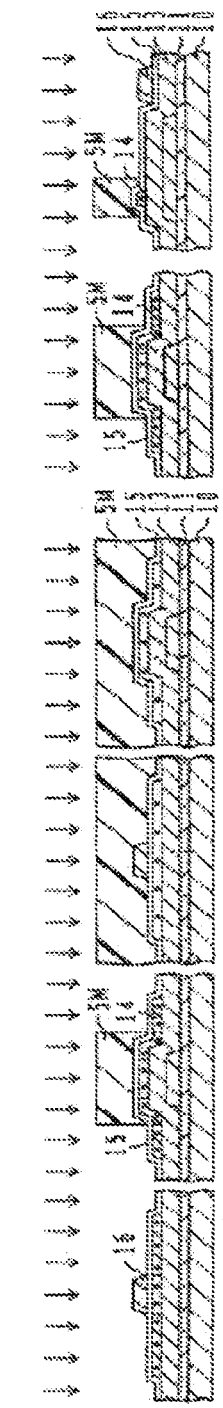
Figure 1H:
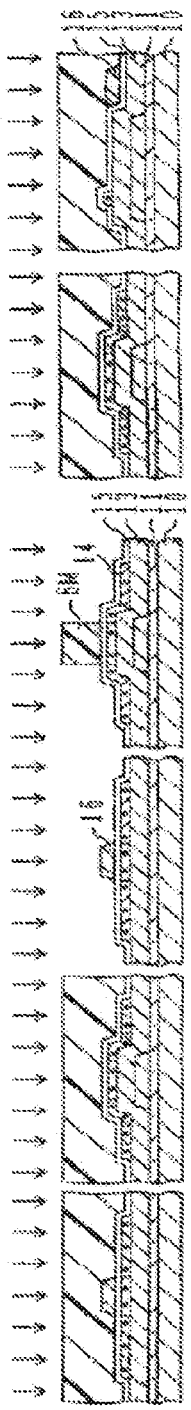
Figure 1I:
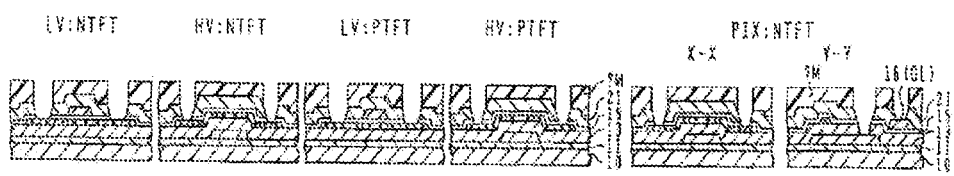
Figure 1J:
Figure 1K:
Figure 1L:
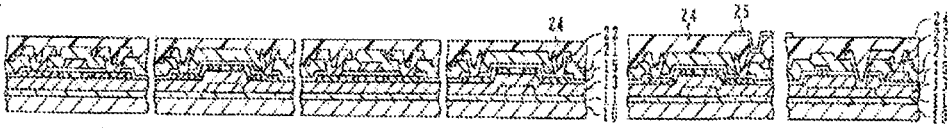
Figure 2A:
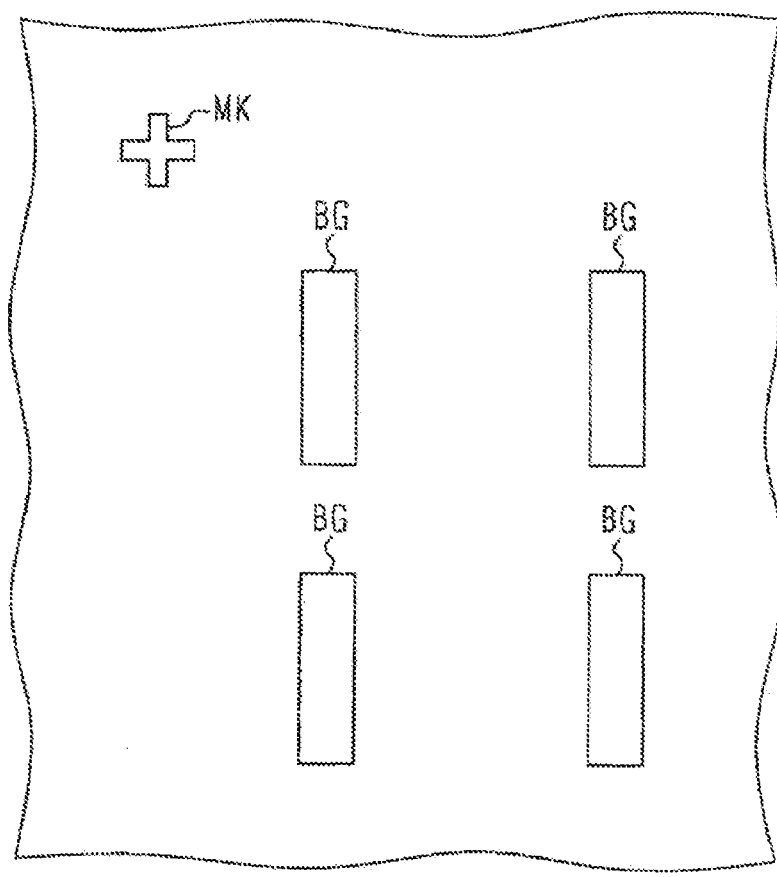
FIG. 2A is a plan view of the first conductive film pattern of a bottom gate, which is formed on a panel, according to the first embodiment of the present invention.

FIGS. 1A through 1L are cross-sectional views showing the first embodiment of the present invention, FIG. 2 is a plan view of a substrate, and FIGS. 3A through 3G are plan views of a pixel section.

With reference to FIGS. 1A through 1L, the following explains a manufacturing method of a thin film transistor substrate according to the first embodiment of the present invention. A CMOS thin film transistor (TFT) having a high pressure resistance (HV), and a low voltage (LV) thin film transistor (TFT) are formed on the periphery circuit. They are hereinafter referred to as HV:NTFT, HV:PTFT, LV:NTFT, and LV:PTFT. N and P respectively denote n-type and p-type. An n-channel pixel (PIX) transistor having a high pressure resistance is formed on the display region. This transistor is referred to as PIX:NTFT. FIGS. 3A through 3G are plan views for showing plan shapes of the pixel TFT section. The following explains these five types of transistors as embodiments of the present invention.

FIGS. 1A through 1M show from the left CMOS circuit sections of LV:NTFT, HV:NTFT, LV:PTFT, and HV:PTFT, and on the right two cross-sectional views of pixel transistor PIX:NTFT, respectively taken along a source-drain (X-X) line and a gate (X-Y) line. Note that, the pixel transistor often has a double gate structure, but this pixel transistor has a single gate structure.

As shown in FIG. 1A, a bottom gate electrode is formed above the substrate via a base layer. For example, a 50 nm thick silicon nitride film and a 400 nm thick silicon oxide film, both serving as a base insulating film 11, are deposited by plasma CVD (PE-CVD), and a 300 nm thick Mo film 12 is deposited thereon by sputtering.

Figure 3A:
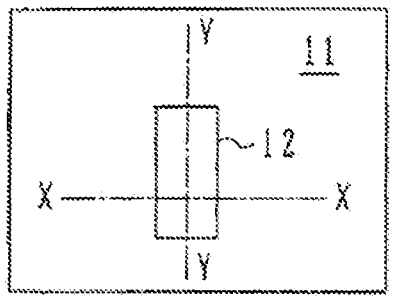
FIGS. 3A through 3G are plan views for showing a structure of a pixel section according to the first embodiment of the present invention.

A resist pattern 1M is formed on a Mo film 12, and the Mo film is subjected to dry etching with a fluorine gas, or to wet etching with a phosphoric acid-nitric acid etchant by using the resist pattern 1M as a mask. Meanwhile, a bottom gate electrode 12 is formed on a pixel TFT, as shown in FIG. 3A. The bottom gate electrode is a gate electrode for a high pressure resistant transistor of HV:NTFT, HV:PTFT, and PIX:NTFT. After that, the resist pattern 1M is removed by a resist remover or the like.

As shown in FIG. 2, a marker MK is formed at the same time when the bottom gate electrode BG is formed, from the same metal film. The Marker MK is provided at an arbitrary position. For example, the markers MK are formed on the four corners on each panel.

As shown in FIG. 1B, a first (bottom) gate insulating film 13 having a large thickness, and a semiconductor film 14 initially having an amorphous state is formed on the base insulating film 11 so as to cover the bottom gate electrode 12. For example, a 100 nm thick silicon oxide (SiO) film 13 and a 100 nm thick amorphous silicon film 14 are deposited by plasma (PE-) chemical vapor deposition (CVD). Though the marker is covered by these films, it is detectable because of its material difference and level difference. Further, the film deposited on the marker can be removed if necessary. Then the amorphous silicon film 14 is crystallized by subjecting only a desired part to laser irradiation with a continuous wave of solid state laser beam LB using the marker. As a result, a large-grained polycrystal silicon film is formed.

Note that, the following arrangement suppresses deformation of glass substrate at the time of laser irradiation and also prevent the ablation caused by hydrogen. That is, after the amorphous silicon film is deposited, the substrate is subjected to annealing for two hours at 550° C. before subjected to laser irradiation, and the hydrogen concentration of the film is adjusted to approximately 1%. Further, depending on the condition required, the continuous wave of solid state laser beam may instead be other laser light.

Figure 3E:
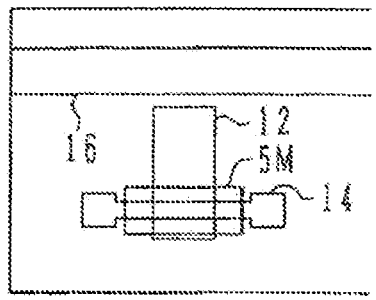
Figure 3B:
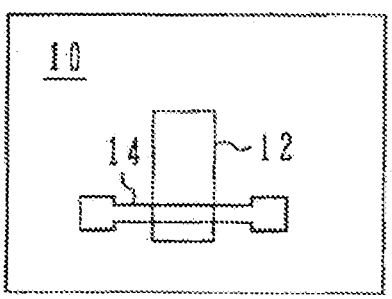

As shown in FIG. 1C, the polycrystal semiconductor film is patterned into the shape of a desired transistor. For example, a photo resist film is applied on the polycrystal silicon film 14, and is formed into a resist pattern 2M, which pattern is, for example, a desired TFT shape, through exposure and development. Then, the polycrystal silicon film 14 is subjected to dry etching using the resist pattern 2M as the etchant mask and using a fluorine gas (e.g. freon gas) as the etchant gas. After that, the resist pattern 2M is removed (peeled off). In the pixel TFT, a semiconductor film 14 is formed across the bottom gate 12, as shown in FIG. 3B.

As shown in FIG. 1D, an silicon oxide (SiO) film 15 is deposited by plasma CVD on the first gate insulating film 13 with a thickness of, for example, 30 nm. The silicon oxide (SiO) film 15 serves as a second (top) gate insulating film having a small thickness and covers the patterned silicon film 14. Further, a 300 nm thick Mo film 16 is deposited thereon by sputtering as a second conductive film for forming the top gate.

Figure 3F:
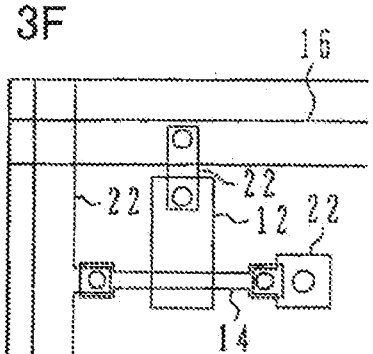
Figure 3C:
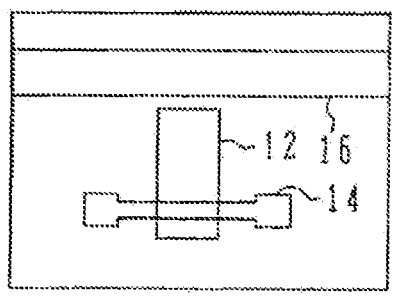

As shown in FIG. 1E, a resist pattern 3M is formed on the second conductive film 16, and the second conductive film 16 is etched by using the resist pattern 3M as the etching mask. The Mo film is subjected to either dry etching with a fluorine gas or wet etching with a phosphoric acid-nitric acid etchant. After that, the resist pattern 3M is peeled off. Meanwhile, top gate electrodes are formed on the thin gate insulating film to be used for the low voltage transistors LV:NTFT and LV:PTFT, completing basic structures of the high pressure resistant transistor and a low voltage transistor. In the display region, a gate bus line 16 (GL) is so formed as to pass through the vicinity of the pixel transistor PIX: NTFT, as shown in FIG. 3C. After that, each transistor is subjected to doping.

Figure 2B:
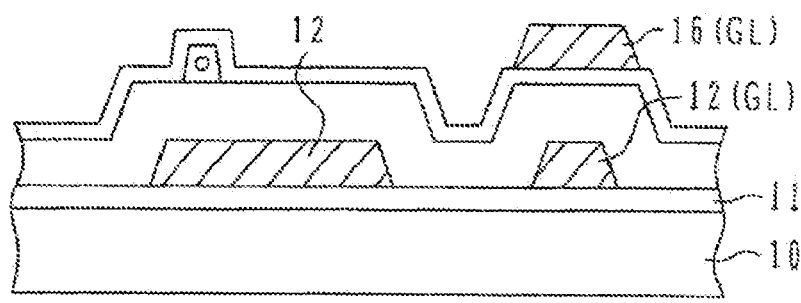
FIG. 2B is a cross-sectional view of a gate bus line according to a modification example.

As shown in FIG. 2B, the gate bus line GL may be formed by stacking the first conductive film 12 and the second conductive film 16. In this case, the first and second conductive films 12 and 16 are connected in the subsequent wire-forming process. This structure has an effect of reducing a resistance of gate bus line than the structure in which the gate bus line is formed only of the second conductive film.

Figure 3G:
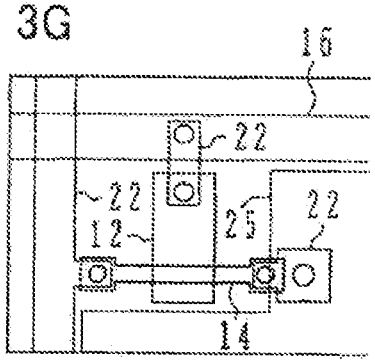
Figure 3D:
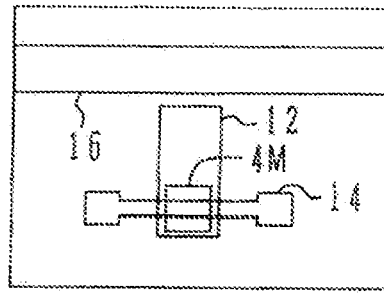

As shown in FIG. 1F, each of the high pressure resistance n-type transistors HV: NTFT and PIX:NTFT is doped with an n-type impurity for forming a LDD region having a GOLD structure. Then, a resist patterns 4M is so formed as to cover the p-type transistor PTFT, the n-type transistor LV: NTFT of the top gate, the high pressure resistance n-type transistor HV: NTFT, and the channel region of PIX: NTFT. FIG. 3D shows a plan view of the resist pattern 4M in the pixel section. The resist pattern 4M is formed across the semiconductor film 14 on a portion set back from an end portion (the end in terms of direction of current flow) of the bottom gate electrode 12.

Using the resist pattern 4M as a mask, the LDD region of a GOLD structure of the high pressure resistance n-type transistors HV: NTFT and PIX:NTFT is doped with a low concentration n-type impurity through the thin top gate insulating film 15. For example, $1 \times 10^{14}$ cm$^{-2}$ (hereinafter expressed as 1E14) dose of a phosphor ion is injected at an increasing energy of 30 keV with an ion doping device. Thereafter, the resist pattern 4M is peeled off.

The high pressure resistance transistor has a bottom gate structure, and therefore its gate electrode is provided therebeneath. This layout allows flexible doping of impurity from above. Because the gate insulating film 15 on the semiconductor film 14 is thin, it allows an efficient ion doping. Then, the high concentration source-drain region of the n-type transistor is doped with impurity.

As shown in FIG. 1G, a high concentration n-type impurity is injected into an n-type transistor so as to form a source/drain region. First, a resist pattern 5M is formed over the p-type transistor region. The resist pattern 5M has an opening for exposing the source/drain region of the high pressure resistance n-type transistor, and the entire area of the low voltage n-type transistor. FIG. 3E shows a shape of the resist pattern 5M on the pixel transistor. The resist pattern 5M covers the channel region and the LDD region of the high pressure resistant transistor, and has an opening for exposing a part of the bottom gate electrode 12, which part has a certain distance from the end portion (the end portion in terms of direction of current flow) of the bottom gate electrode 12. The entire region of the low voltage n-type transistor is exposed from the opening, and the top gate electrode 16 serves as a mask. 1E15 (dosage) of an n-type impurity phosphor ion is injected at an increasing energy of 30 keV by using the resist pattern 5M and the top gate electrode 16 which serve as masks. After that the resist pattern 5M is removed. There is usually some difficulties in peeling the resist which has been subjected to high concentration ion injection, and therefore the peeling is preferably performed by ashing.

In the high pressure resistance n-type transistor HV: NTFT, and in the pixel transistor PIX: NTFT, a high concentration source/drain region is formed in a part having a certain distance from the bottom gate electrode 12. Further, an LDD region is formed on the entire area of the part which extends from overlapping portion with the gate electrode to a certain extent outside the gate electrode 12. This is a GOLD structure with high pressure resistance and small leak current.

As shown in FIG. 1H, a resist pattern 6M is formed so as to cover the entire area of the n-type transistor and the channel region of the p-type top gate transistor, with an opening for exposing the entire area of the p-type bottom gate transistor. A p-type source/drain region is formed by injecting 2E15 (dosage) of an p-type impurity boron ion at an increasing energy of 30 keV by using the resist pattern 6M and the top gate electrode 16 which serve as masks. Thereafter, the resist pattern 6M is peeled off by ashing. After the impurity injection, annealing is carried out for two hours at 500° C. under $N_2$ atmosphere by using an annealing device so as to activate the impurity.

As shown in FIG. 1I, the first interlayer insulating film 21 is formed with contact holes. For example, a 370 nm thick silicon nitride (SiN) film 21 is deposited by plasma CVD. Here, the semiconductor film may be hydrogenated by way of a heat treatment at about 450° C. This hydrogenation using hydrogen is effective because a silicon nitride film formed by CVD contains hydrogen. This hydrogenation may be performed at some later stage. The first interlayer insulating film may be formed by such as a silicon oxide or a silicon nitride-oxide. Regardless of the material of the first interlayer insulating film, the heat treatment may be performed at 300° C. to 400° C. under $H_2$—$N_2$ atmosphere.

A resist pattern 7M is formed on the SiN film 21 as a mask pattern of a contact hole. The SiN film 21 is first etched by fluorine gas by using the resist pattern 7M as a mask, which exposes the gate bus line 16 (GL) shown at the right end. Then, the SiO film 15, which is a thinner (30 nm) second gate insulating film, is subjected to dry etching to expose the semiconductor film 14. After exposing the source/drain region of the polycrystal silicon, the silicon oxide film 13 in the contact hole of the bottom gate, which has a thickness of, for example, 100 nm, is etched. Thereafter, the resist pattern 7M is peeled off.

Note that, in the dry etching process of the first gate insulating film of silicon oxide, the exposed silicon semiconductor film is also etched. The etching selectivity is required to be very high. The silicon oxide film, especially for one having a large thickness, may be subjected to wet etching by using a dilute hydrofluoric acid.

As shown in FIG. 1J, a third conductive film 22 serving as a source/drain electrode is deposited. For example, a Ti/Al/Ti film is deposited by sputtering with a thickness of 50/200/100 nm.

As shown in FIG. 1K, the third conductive film 22 is patterned by using the electrode/wire shaped resist pattern as a mask, with a chlorine gas which serves as an etchant. After that, the resist pattern is peeled off. FIG. 3F shows a plane shape of the electrode/wire 22 of the pixel section. The drain electrode of the pixel transistor which is continuous to the drain bus line comes in contact with the drain region of the semiconductor film. In the source region, a pad is formed as a contact section to be in contact with a transparent pixel electrode formed of an indium-tin-oxide (ITO) or the like. When the ITO directly comes in contact with silicon, it results in ohmic contact. A sufficient panel characteristic is thus not ensured.

As shown in FIG. 1L, a second interlayer insulating film 24 is formed with a contact hole for the transparent electrode, and a transparent electrode 25 is deposited thereon and patterned. For example, a photosensitive transparent organic resin film 24 is applied, and then patterned through exposure and development. Then a contact hole is made on the layer to expose the pad on the source region of the pixel TFT. Thereafter the organic resin film 24 is fixed by heat. A 70 nm thick ITO film 25 is sputtered on the organic resin film 24, and is patterned by wet etching with an ITO etcher, using the resist pattern as the etchant mask. After that, the resist pattern is removed. The resulting transparent electrode is conducted to the source of the pixel TFT. FIG. 3G shows a plan view of the transparent electrode 25.

Note that, the transparent electrode is hardly required in the periphery circuits. When a test terminal is provided to examine the circuit operation, an ITO film is formed on the test terminal.

FIGS. 4A through 4E show a modification example of the first embodiment. FIG. 4A shows the same state as that of FIG. 1D. The following explains the modification mainly for the different parts from the first embodiment.

FIG. 4B shows a process of forming a resist pattern 3MR and an etching process of the second conductive film 16 using the resist pattern 3MR as an etchant mask. The process is the same as that of FIG. 1E. Note that the resist pattern 3MR has not only a top gate pattern but also a LDD injection mask pattern on the bottom gate transistor. A top gate electrode (TG) 16 is formed on the top gate transistor and a dummy top gate electrode 16 (DTG) is formed on the bottom gate transistor.

FIG. 4C shows a process of injecting low concentration n-type impurity into the high pressure resistance n-type transistor HV: NTFT and into PIX: NTFT, so as to from a GOLD structure region on each TFT. The process is the same as that of FIG. 1F. Without a resist pattern, a low concentration n-type impurity is injected by using the top gate 16 (TG) and the dummy top gate 16 (DTG) which serve as masks. Here, the low concentration impurity is involuntarily injected also to the p-type TFT, but this will not cause a problem because the later high concentration p-type impurity injection will compensate it. Thereafter, as shown in FIG. 1G, a resist pattern 5M is formed, and a high concentration n-type impurity is injected. Though the dummy top gate electrode (DTG) 16 remains under the resist pattern 5M, this process is carried out in the same manner.

FIG. 4D shows an injection step of p-type impurity into the p-type TFT, which process is the same as that of FIG. 1H. The n-type transistor region is covered by the resist pattern 6MR. An opening is formed on the p-type transistor region, and the top gate electrode (TG) 16 and the dummy top gate electrode (DTG) 16 serve as masks. Then p-type impurity boron is injected using the resist pattern 6MR, the top gate electrode (TG) 16, and the dummy top gate electrode (DTG) 16, which serve as masks.

FIG. 4E shows a process of removing the dummy gate electrode, which is no longer required after the impurity injection process. The resist pattern 4MR covers the top gate electrode (TG) 16 and the gate bus line (GL) 16, and the Mo film, i.e., the dummy top gate electrode (DTG) 16 is removed by etching. After that, the process sequence is repeated from FIG. 1I.

In this modification example, the ion injection for the LDD region is performed without a resist pattern. However, only the resist pattern 4MR is used for the removal process of the dummy gate electrode, the process can be carried out with the same number of masks.

In the first embodiment and in the foregoing modification example, the first gate insulating film is required to be etched after the semiconductor film is exposed, in the step of forming the contact hole. In this case, the semiconductor film may be damaged during the etching of the first gate insulating film having a large thickness.

FIGS. 5A through 5I are cross-sectional views showing conditions of substrate in the thin film transistor substrate manufacturing method according to the second embodiment of the present invention. The figures show from the left five transistors: a low voltage n-type transistor LV:NTFT, a high pressure resistance n-type transistor HV:NTFT, a low voltage p-type transistor LV:PTFT, a high pressure resistance p-type transistor HV: PTFT, and a pixel transistor PIX: NTFT. The following explains mainly the parts different from the first embodiment.

As shown in FIG. 5A, the bottom gate electrode 12 (and a marker) is formed, and the first gate insulating film 13 and the amorphous semiconductor film 14 are deposited thereon. The lamination is then irradiated with a continuous wave of solid state laser beam LB to be polycrystallized. These steps are the same as those of FIGS. 1A and 1B.

As shown in FIG. 5B, a resist pattern 2M is formed as a patterning mask of the polycrystal silicon semiconductor film 14. Using this resist pattern, the semiconductor film 14 made of a polycrystal silicon and the first gate insulating film 13 made of an silicon oxide are subjected to dry etching with a fluorine gas. In the pixel section, the contact section of the bottom gate electrode is exposed.

As shown in FIG. 5C, the second (top) gate insulating film 15 having a small thickness is deposited on the base insulating film 11 by plasma CVD so as to cover the lamination of the patterned semiconductor film 14 and the first gate insulating film 13. Then the second conductive film 16 for forming a top gate is deposited on the top of lamination by sputtering.

As shown in FIG. 5D, the resist pattern 3M is formed on the second conductive film 16, and the second conductive film 16 is etched by using the resist pattern 3M as an etching mask. After that, the resist pattern 3M is peeled off. A top gate electrode is formed on a thin gate insulating film in each of the low voltage transistors LV: NTFT and LV: PTFT. As shown in the right end of the figure, the gate bus line 16 (GL) is formed on the substrate 10 via the thin gate insulating film 15. Only the thin gate insulating film 15 is formed on the contact section of the bottom gate electrode.

As shown in FIG. 5E, each of the high pressure resistance n-type transistors HV: NTFT and PIX: NTFT is doped with an n-type impurity for forming a LDD region of a GOLD structure. Then, a resist patterns 4M is so formed as to cover the p-type transistor PTFT, the n-type transistor LV: NTFT of the top gate, the high pressure resistance n-type transistor HV: NTFT of the bottom gate, and the channel region of PIX: NTFT. The resist pattern 4M is formed across the semiconductor film 14 on a portion set back from an end portion (the end in terms of direction of current flow) of the bottom gate electrode 12.

Using the resist pattern 4M as a mask, the LDD region of a GOLD structure of each of the high pressure resistance transistors HV: NTFT and PIX:NTFT is doped with a low concentration n-type impurity through the thin top gate insulating film 15. Thereafter, the resist pattern 4M is peeled off.

As shown in FIG. 5F, a high concentration n-type impurity is injected into an n-type transistor so as to form a source/drain region. First, a resist pattern 5M is formed over the p-type transistor region. The resist pattern 5M has an opening for exposing the source/drain region of the high pressure resistance n-type transistor, and the entire area of the low voltage n-type transistor. The resist pattern 5M covers the channel region and the LDD region of the high pressure resistant transistor, and has an opening for exposing a part of the bottom gate electrode 12, which part has a certain distance from the end portion (the end portion in terms of direction of current flow) of the bottom gate electrode 12. The entire region of the low voltage n-type transistor is exposed from the opening, and the top gate electrode 16 serves as a mask. A high concentration n-type impurity phosphor ion is injected by using the resist pattern 5M and the top gate electrode 16 which serve as masks. After that the resist pattern 5M is removed by ashing.

As shown in FIG. 5G, a resist pattern 6M is formed so as to cover the entire area of the n-type transistor and the channel region of the p-type bottom gate transistor, with an opening for exposing the entire area of the p-type bottom gate transistor. A p-type source/drain region is formed by injecting an p-type impurity boron ion by using the resist pattern 6M and the top gate electrode 16 which serve as masks. Thereafter, the resist pattern 6M is peeled off by ashing.

The impurity injecting step is carried out basically in the same manner as that shown in FIGS. 1F through 1H. In the second embodiment, the first gate insulating film 13 outside the semiconductor film is removed, and therefore the cross sectional view of the structure above the second gate insulating film is different from that of the first embodiment. After the impurity injection, annealing is carried out so as to activate the impurity.

As shown in FIG. 5H, the first interlayer insulating film 21 is formed with contact holes. For example, a silicon nitride (SiN) film 21 is deposited by plasma CVD. The semiconductor film is hydrogenated by a heat treatment at about 450° C. Then the resist pattern 7M is formed on the SiN film 21 as a mask pattern of a contact hole. The SiN film 21 and the SiO film 15 are subjected to dry etching by fluorine gas by using the resist pattern 7M as a mask. In the contact section of the bottom gate electrode, the first insulating film 13 has been removed, and therefore the contact section of the bottom gate electrode is also exposed when the source/drain region of the polycrystal silicon film 14 is exposed.

As shown in FIG. 5I, a third conductive film 22 serving as a source/drain electrode is deposited. For example, a Ti/Al/Ti film is deposited by sputtering with a thickness of 50/200/100 nm. The third conductive film 22 is patterned by using the electrode/wire shaped resist pattern as a mask, with a chlorine gas which serves as an etchant. After that, the resist pattern is peeled off.

After that, the process after FIG. 1L is carried out so as to form a thin film transistor substrate. In the present embodiment, the bottom gate insulating film is etched into an island semiconductor shape, and therefore only the interlayer insulating film and the top gate insulating film are etched in the contact hole forming process. The second embodiment causes less damage to the polycrystal silicon semiconductor film compared to the first embodiment. The modification example of the first embodiment shown in FIG. 4 is also applicable to the second embodiment.

FIGS. 6A through 6E are cross sectional views showing conditions of substrate in a modification example of the second embodiment.

FIG. 6A shows the same state as that of FIG. 5C. The bottom gate electrode 12 is formed on the substrate 10 via the base insulating film 11. Then the first gate insulating film 13 and the semiconductor film 14 are formed and patterned into the same shape. The second gate insulating film 15 and the second conductive film 16 are formed over the lamination of the semiconductor film 14 and the first gate insulating film 13.

FIG. 6B shows a process of forming a resist pattern 3MR on the second conductive film 16, and an etching process of the second conductive film 16 using the resist pattern 3MR as an etchant mask. The process is the same as that of FIG. 4B. The resist pattern 3MR has not only a top gate pattern but also a LDD injection mask pattern on the bottom gate transistor. A top gate electrode (TG) 16 is formed on the top gate transistor and a dummy top gate electrode 16 (DTG) is formed on the bottom gate transistor.

FIG. 6C shows a process of injecting low concentration n-type impurity into the high pressure resistance n-type transistor HV: NTFT and into PIX: NTFT, so as to from a GOLD structure region on each TFT. The process is the same as that of FIG. 4C. The top gate 16 (TG) and the dummy top gate 16 (DTG) serve as masks. Here, the low concentration of n-type impurity is involuntarily injected also to the p-type TFT, but this will not cause a problem because the later high concentration p-type impurity injection will compensate it. Thereafter, as shown in FIG. 1G, a resist pattern 5M is formed, and a high concentration n-type impurity is injected. Though the dummy top gate electrode (DTG) 16 remains under the resist pattern 5M, this process is carried out in the same manner.

FIG. 6D shows an injection step of p-type impurity into the p-type TFT, which process is the same as that of FIG. 4D. The n-type transistor region is covered by the resist pattern 6MR. An opening is formed on the p-type transistor region, and the top gate electrode (TG) 16 and the dummy top gate electrode (DTG) 16 serve as masks. Then p-type impurity boron is injected using the resist pattern 6MR, the top gate electrode (TG) 16, and the dummy top gate electrode (DTG) 16, which serve as masks.

FIG. 6E shows a process of removing the dummy gate electrode, which is no longer required after the impurity injection process. The process is the same as that of FIG. 4E. The resist pattern 4MR is formed to cover the top gate electrode (TG) 16 and the gate bus line (GL) 16, and the Mo film, i.e., the dummy top gate electrode (DTG) 16 is removed by etching. After that, the process sequence is repeated from FIG. 1I.

In this modification example, the ion injection for the LDD region is performed without a resist pattern. However, only the resist pattern 4MR is used for the removal process of the dummy gate electrode, the process can be carried out with the same number of masks.

In the foregoing example, the impurity injection is carried out after the formation of the top gate electrode. Therefore, the top gate transistor has a structure not including a LDD region. The top gate transistor may be optionally provided with LDD region of the GOLD structure by carrying out impurity injection before forming the top gate electrode.

As shown in FIG. 7A, after the island shaped semiconductor film is formed in the step 1C, the second gate insulating film 15 is deposited, and a resist pattern 4MS is formed on the second gate insulating film 15 as a mask pattern of a LDD region of n-type transistor. Then, using the resist pattern 4MS as a mask, a low concentration n-type impurity phosphor ion is injected into the LDD region. Thereafter, the resist pattern 4MS is removed.

As shown in FIG. 7B, a resist pattern 5MS is formed as a mask pattern of the high concentration source/drain region of the n-type transistor. Then high concentration n-type impurity phosphor ion is injected so as to form the source/drain region by using the resist pattern 5MS as a mask. After that, the resist pattern 5MS is removed.

As shown in FIG. 7C, the second conductive film 16 is formed on the second gate insulating film 15.

As shown in FIG. 7D, a resist pattern 3M is formed as a mask pattern of the top gate electrode. Using the resist pattern 3M as a mask, the second conductive film 16 is subjected to dry etching by using fluorine gas or the like as an etchant. After that, the resist pattern 3M is removed. Then the process after FIG. 1H is carried out. This modification example is shown as a modification of the first embodiment, but this is applicable also to the other embodiments.

The LDD region of the GOLD structure is also formed beneath the top gate electrode so that a part of the LDD region is overlapped with the gate electrode. Since some margin is required for positioning, the top gate transistor has a larger area than that not having the LDD region. A desirable structure may be chosen according to the circumstance.

The foregoing embodiment carries out the injection of p-type transistor impurity after the injection of n-type transistor impurity; however, the respective impurity injecting steps may be carried out in an arbitrary order. In the second embodiment, the first gate insulating film on the contact section of the bottom gate electrode is etched by using the etching mask of the island shaped semiconductor film. However, the removal of the first gate insulating film on the contact section of the bottom gate electrode may be carried out in a different process.

FIGS. 8A through 8E show the third embodiment of the present invention.

Figures 8A, 8B, 8C, 8D, 8E:
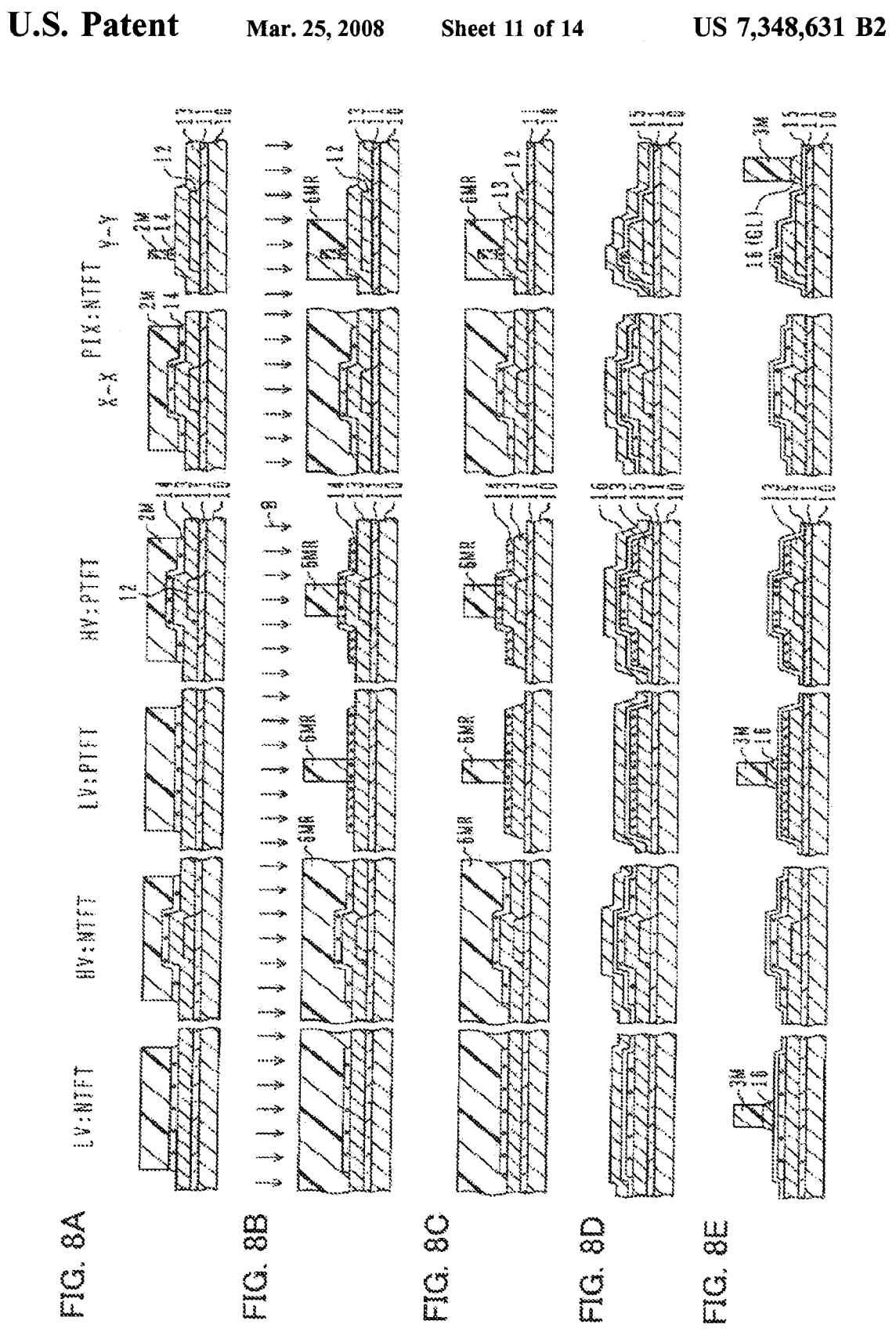

As shown in FIG. 8A, after forming the semiconductor film 14, a resist pattern 2M is formed and the semiconductor film 14 is patterned into an island shape by using a fluorine-type etchant. Thereafter, the resist pattern 2M is removed.

As shown in FIG. 8B, a resist pattern 6MR is formed as a mask pattern of p-type transistor source/drain region. The resist pattern 6MR covers the pixel TFT in the pixel transistor section, but has an opening for exposing the contact section of the bottom gate electrode. The p-type impurity boron ion is injected by using the resist pattern 6MR as a mask, so as to form a p-type transistor source/drain region.

As shown in FIG. 8C, the SiO film of the first gate insulating film 13 is subjected to wet etching with a dilute hydrofluoric acid, or to dry etching with a fluorine gas by using the resist pattern 6MR as a mask. The conditions of the dry etching must be adjusted so as to ensure a sufficient etching selectivity of the p-Si film to SiO film. In the p-type transistor section, the first gate insulating film is patterned into the same shape as that of the island-shaped semiconductor film 14. In the bottom gate electrode section of the pixel section, the first gate insulating film is removed from the contact section. After that, the resist pattern 6MR is removed.

As shown in FIG. 8D, the second gate insulating film 15 and the second conductive film 16 are formed over the semiconductor film 14.

As shown in FIG. 8E, a resist pattern 3M is formed as a mask pattern of the second conductive film. The second conductive film 16 is etched by using this resist pattern 3M, so as to form a top gate electrode 16 and a gate bus line (GL) 16. Thereafter, the resist pattern 3M is removed.

After that, as shown in FIGS. 1F and 1G, an n-type impurity is injected to the n-type transistor. The p-type transistor has been already subjected to impurity injection, and therefore the process sequence is carried out from the step of FIG. 1I, omitting the step 1H.

FIGS. 9A through 9E show an modification example of the third embodiment. This modification example uses a dummy top gate electrode.

FIG. 9A shows the same state as that of FIG. 8D in which the source/drain region has just been formed by the impurity injection. The semiconductor film 14 is covered by the second gate insulating film 15 and the second conductive film 16.

FIG. 9B shows a process of forming a resist pattern 3MR on the second conductive film 16, and an etching process of the second conductive film 16 using the resist pattern 3MR as an etchant mask. The process is the same as that of FIG. 4B. The resist pattern 3MR has not only a top gate pattern but also a LDD injection mask pattern on the bottom gate transistor. Together with the top gate electrode (TG) 16 and the gate bus line (GL) 16 on the top gate transistor, a dummy top gate electrode 16 (DTG) is formed on the bottom gate transistor.

FIG. 9C shows a process of injecting low concentration n-type impurity into the high pressure resistance n-type transistor HV: NTFT and into PIX: NTFT, so as to from a GOLD structure region on each TFT. The process is the same as that of FIG. 4C. The top gate 16 (TG) and the dummy top gate 16 (DTG) serve as masks. Here, the low concentration impurity is involuntarily injected also to the p-type TFT, but this will not cause a problem because the later high concentration p-type impurity injection will compensate it.

As shown in FIG. 9D, a resist pattern 5M is formed, and a high concentration n-type impurity is injected according to the resist pattern 5M. Though the dummy top gate electrode (DTG) 16 remains under the resist pattern 5M, this process is carried out in the same manner.

FIG. 9E shows a process of removing the dummy gate electrode, which is no longer required after the impurity injection process. The process is the same as that of FIG. 4E. The resist pattern 4MR is formed to cover the top gate electrode (TG) 16 and the gate bus line (GL) 16, and the Mo film, i.e., the dummy top gate electrode (DTG) 16 is removed by etching. After that, the process sequence is repeated from FIG. 1I.

In this modification example, the ion injection for forming the LDD region in the n-type transistor is performed without a resist pattern. However, only the resist pattern 4MR is used for the removal process of the dummy gate electrode, the process can be carried out with the same number of masks.

As in the above-described embodiment, the TFT shown in FIG. 10 is formed on an active matrix substrate. Other components than the TFTs may be formed by any publicly-known techniques. An EL display device may be manufactured instead of manufacturing a liquid crystal display device.

Figure 11A:
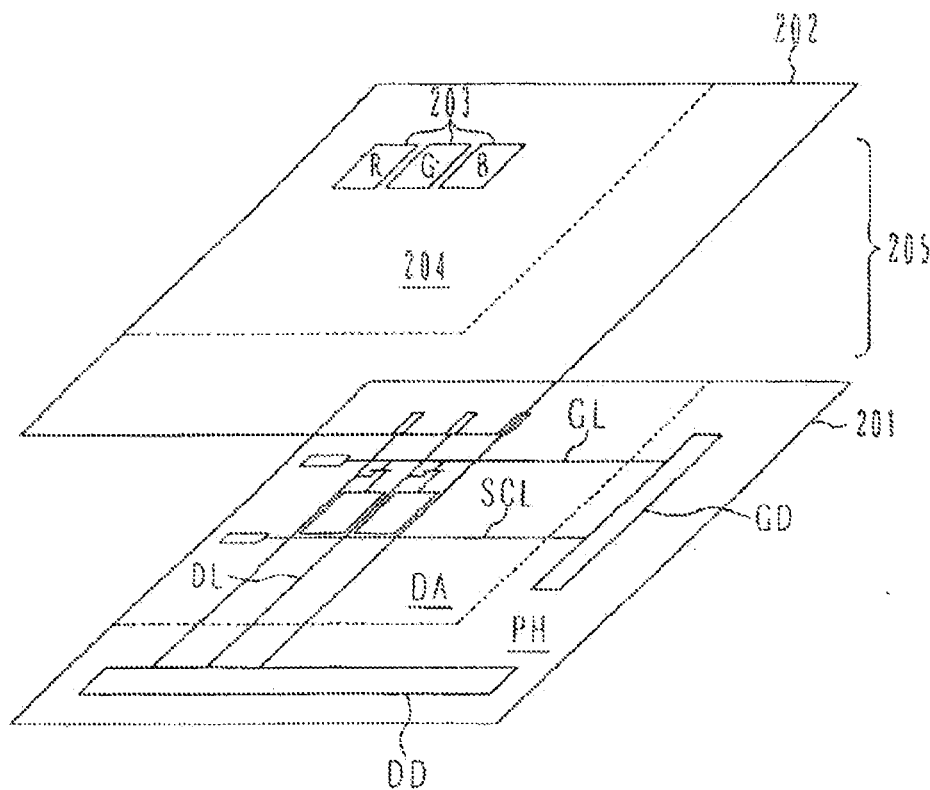
FIGS. 11A and 11B are a projection view and a cross-sectional view, each showing a structure example of a display device.

FIG. 11A shows a structure example of a liquid crystal display device. In an active matrix substrate 201, there are a display region DA and a periphery circuit region PH. In the display region DA, a scanning gate wire GL, an auxiliary capacitor bus line SCL, a data wire DL and a pixel structure are provided. In the periphery circuit region PH, a gate control circuit GD and a data control circuit DD are formed. In a counter substrate 202, a color filter 203 and a common electrode 204, which is shared by all pixels, are formed. A liquid crystal layer 205 is held between the color filter substrate 202 and the active matrix substrate 201.

Figure 11B:
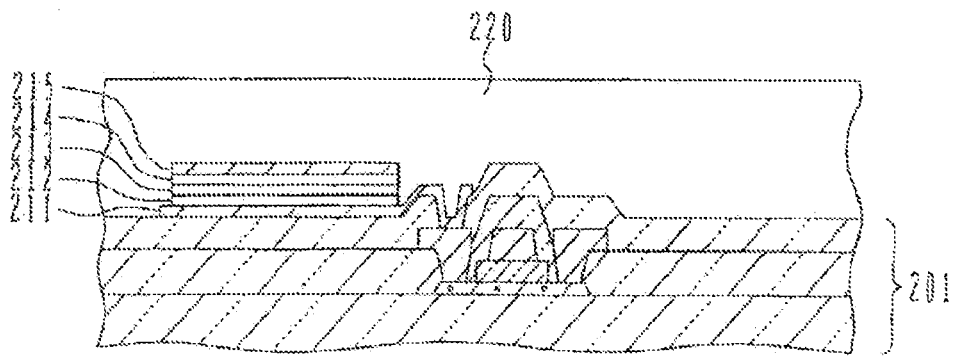

FIG. 11B shows a structure example of an organic EL panel. As with the above-mentioned example, the active matrix substrate 201 is constituted of a glass substrate on which a scanning gate wire, a data wire, thin film transistors, etc. are formed. In each pixel region, the source of TFT is connected to an anode 211 made of ITO, for example. On the anode 211, a cathode 215 is laminated. The cathode 215 is constituted of a hole transporting layer 212, a light emission layer 213, an electron transporting layer 214, and aluminum etc. Such a lamination serves as an organic EL element. The light emitted from the organic EL element travels downward, and goes out of the element from the glass substrate of the active matrix substrate 201. The upper face of the organic EL element is covered by a seal material 220.

The present invention is not limited to the description of the embodiments above. For example, the described materials or thicknesses in the examples may be altered by a skilled person according to the target design. For example, the transparent substrate may be made of a silicon dioxide instead of glass. The gate electrode film may be made of a metal layer having the required characteristics, such as conductivity, heat resistance etc. Apart from B and P, Sb, As etc. may be used as p-type/n-type impurities. The gate insulating film may be formed by other insulating materials than a silicon oxide film, such as a silicon oxide-nitride film, a silicon nitride film, or an organic insulating film. As to the general TFT technique, the embodiments of Tokukai 2004-228480 (published on Aug. 12, 2004)(U.S. Ser. No. 10/766, 559) and Tokugan 2004-302572 can be good references. As it is obvious for one skilled in the art, the present invention may be modified/updated, or differently combined.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The thin film transistor substrate and its manufacturing method according to the present invention is suitable for a thin film transistor substrate used for a display device, such as a liquid crystal display device, and the manufacturing process for the substrate.

What is claimed is:

1. A thin film transistor substrate, comprising:
   a substrate;
   a first bottom gate electrode formed above the substrate;
   a first gate insulating film formed above the substrate, the first gate insulating film covering the first bottom gate electrode;
   a plurality of island-shaped semiconductor films formed above the first gate insulating film, the island-shaped semiconductor films including a first island-shaped semiconductor film which intersects with the first bottom gate electrode;
   a second gate insulating film formed above the first gate insulating film, the second gate insulating film being thinner than the first gate insulating film and covering the plurality of island-shaped semiconductor films;
   a first top gate electrode formed above the second gate insulating film, the first top gate electrode intersecting with a second island-shaped semiconductor film of the plurality of island-shaped semiconductor films which does not intersect with the first bottom gate electrode;
   a first conductive type source/drain region formed on each of the first and second island-shaped semiconductor films, the first conductive type source/drain region being formed on either side of the first or second gate electrode; and
   a first conductive type LDD region formed on the first island-shaped semiconductor film, the first conductive type LDD region being formed on a portion more inside than the first conductive type source/drain region and partially covering the first bottom gate electrode excluding a channel region which resides above the first bottom gate electrode, the first conductive type LDD region being lower in impurity concentration than the first conductive type source/drain region.

2. The thin film transistor substrate as set forth in claim 1, further comprising:

a marker formed above the substrate, covered with the first gate insulating film, the marker and the first bottom gate electrode constituting a same layer.

3. The thin film transistor substrate as set forth in claim 2, wherein the plurality of island-shaped semiconductor films are crystallized by a continuous wave of solid state laser beam, the first island-shaped semiconductor film has an even polycrystallization property in an area above an end portion of the first bottom gate electrode.

4. The thin film transistor substrate as set forth in claim 1, wherein the first conductive type is n-type, the plurality of island-shaped semiconductor films include a third and forth island-shaped semiconductor films, a second bottom gate electrode is formed beneath the third island-shaped semiconductor film, a second top gate electrode is formed above the fourth island-shaped semiconductor film, a portion outside gate electrodes of the third and forth island-shaped semiconductor films is doped with a p-type impurity, and none of the second, third and fourth island-shaped semiconductor films include a LDD region partially overlapped with a gate electrode.

* * * * *